(12) United States Patent
Bande Martinez et al.

(10) Patent No.: US 7,753,571 B2
(45) Date of Patent: Jul. 13, 2010

(54) REARVIEW MIRROR ASSEMBLY OF AN AUTOMOTIVE VEHICLE WITH A FLASHING DEVICE

(75) Inventors: Daniel Bande Martinez, Barcelona (ES); Santiago Miguel Sanz, L'Hospitalet de Llobregat (ES)

(73) Assignee: Fico Mirrors, SA, Barcelona (ES)

( * ) Notice: Subject to any disclaimer, the term of this patent is extended or adjusted under 35 U.S.C. 154(b) by 582 days.

(21) Appl. No.: 10/591,083

(22) PCT Filed: Mar. 1, 2005

(86) PCT No.: PCT/IB2005/000525

§ 371 (c)(1),
(2), (4) Date: Oct. 8, 2007

(87) PCT Pub. No.: WO2005/084120

PCT Pub. Date: Sep. 15, 2005

(65) Prior Publication Data

US 2008/0130306 A1 Jun. 5, 2008

(30) Foreign Application Priority Data

Mar. 1, 2004 (ES) ................................ 200400564

(51) Int. Cl.
*B60Q 1/26* (2006.01)
(52) U.S. Cl. ........................ 362/494; 362/540; 362/545
(58) Field of Classification Search ................ 362/494, 362/540, 545
See application file for complete search history.

(56) References Cited

U.S. PATENT DOCUMENTS

| 6,099,153 A | 8/2000 | Zimmermann et al. |
| 6,139,171 A | 10/2000 | Waldmann |
| 6,893,146 B2 | 5/2005 | Fiegler et al. |
| 2001/0046136 A1 | 11/2001 | Weber et al. |
| 2004/0008519 A1 | 1/2004 | Todaka et al. |

FOREIGN PATENT DOCUMENTS

| ES | 2 173 429 | 10/2002 |
| JP | 2000-198389 | 7/2000 |
| WO | WO 02/08015 A1 | 1/2002 |
| WO | WO 03/078203 A1 | 9/2003 |

OTHER PUBLICATIONS

International Search Report for PCT International Application PCT/IB2005/000525 mailed Jun. 30, 2005.

*Primary Examiner*—Sandra L O'Shea
*Assistant Examiner*—Meghan K Dunwiddie
(74) *Attorney, Agent, or Firm*—RatnerPrestia

(57) ABSTRACT

The invention relates to a rearview mirror assembly of an automotive vehicle with a flashing device comprising a first opening for the rearview mirror and a second opening in which an outer module is coupled inwardly defining an elongated passage delimited between two walls, an inner wall and an outer wall or cover. It further comprises a double-sided printed-circuit board transverse to the passage, including two light emitters in a first one of its sides and another light emitter in the other side and dividing the elongated passage into two areas. The emitters of the first side projects light along a first of the two areas, this light directly exiting by an end area with desired horizontal and vertical angles, and the other emitter does so along a second one of the two areas, the light exiting through the cover.

51 Claims, 8 Drawing Sheets

REARVIEW MIRROR ASSEMBLY OF AN AUTOMOTIVE VEHICLE WITH A FLASHING DEVICE

This application is a U.S. National Phase application of PCT International Application PCT/IB2005/000525 filed Mar. 1, 2005.

FIELD OF THE ART

This invention generally relates to rearview mirrors of automotive vehicles and particularly to a rearview mirror assembly of an automotive vehicle with a flashing or turn signal device in the form of an outer module coupled to said housing projecting light towards the front and towards the back of said rearview mirror such that it allows complying with the homologations with respect to it.

STATE OF THE ART

Several devices acting as flashing or indicator light devices and incorporated in the casing of a rearview mirror are known, offering both front and side and rear light exits.

Patent application US2003/0174507 (issued as U.S. Pat. No. 6,893,146) proposes a luminaire to be installed in a cover in the form of a cap of an exterior rearview mirror of motor vehicles. Said luminaire has a housing and an electrical lamp arranged inside it, and said housing is completely or partly transparent. When the luminaire is installed, it offers both a front and rear exit with respect to the rearview mirror. A limitation of said application is that the lamp has a very specific shape, specifically a tubular shape and occupies a great part of the mentioned casing.

Another patent reflecting the state of the art is unexamined patent application JP-A-2000-198389 relating to a flasher formed in the rear side of a side mirror of a vehicle. The document contemplates different types of light sources among which are LEDs but their implementation is not very developed.

Finally, U.S. Pat. No. 6,099,153 proposes an exterior rearview mirror for vehicles, preferably motor vehicles. The latter has a light source mounted inside the mirror housing which has an outlet opening through which light is emitted to the outside thanks to a light guide connected to said light source, which light source may be a LED. The patent does not indicate that the light source can act as a flasher.

It is interesting to offer an alternative to the state of the art which contemplates, in a practical manner, the use of LEDs as flashing devices in an outer rearview mirror assembly, the flashes of which are visible both from a front and rear position with respect to the direction of travel, i.e. both by the occupants of the vehicles approaching head-on and those approaching from behind, and that said flashes are projected such that they comply with the respective homologations in the field of the art as regards the projection angles.

EXPLANATION OF THE INVENTION

In a first aspect, the present invention relates to a rearview mirror assembly of an automotive vehicle with a flashing or indicator light device of the type comprising a rearview mirror housing with a first opening in which said rear view mirror is housed and a second opening defined in at least part of the rest of the outer perimeter of said housing which is in the part opposite to the first opening.

Said rearview mirror assembly further comprises:

an outer module which can be coupled to said housing closing said second opening, said module defining inwardly an elongated passage delimited between two walls, an inner wall and an outer wall acting as a cover which is at least partly transparent, said elongated passage in turn defining a path, and a double-sided printed-circuit board, at least partly rigid, including at least one light emitting component in each of its sides, preferably LEDs, said board being electrically connected to a feed and control system located inside said automotive vehicle, and located perpendicularly and transversely with respect to said elongated passage, dividing the latter into two areas, a rear area with respect to the direction of travel extending from said board to an end area adjacent to the rearview mirror and visible together with the latter, and a front area formed by the rest of the elongated passage such that one of said at least two light emitting components projects light along said rear area, this light exiting by said end area of the rear area of said elongated passage with desired horizontal and vertical angles through a transparent portion of said cover, and at least another of said two light emitting components located in the other side of said printed-circuit board projects light along said front area, this light exiting through said cover.

A second aspect of the present invention relates to a rearview mirror assembly which is different from the one proposed by the first aspect only because the double-sided printed-circuit board comprised in the assembly is not necessarily at least partly rigid because furthermore it is not located necessarily perpendicularly with respect to the elongated passage unlike the assembly proposed by the first aspect, therefore it is able to adopt other positions with the desired degree of inclination according to the desired illumination application, and because the feed and control system to which the board is connected is not necessarily located inside said automotive vehicle, being able to be located in the housing of the proposed assembly for example.

In a third aspect, the present invention relates to a rearview mirror assembly of an automotive vehicle with a flashing device of the type comprising a rearview mirror housing with an opening in which said rear view mirror is arranged. At least part of the outer perimeter of said housing which is in the part opposite to said opening, is recessed towards the inside of the housing defining an elongated passage delimited between an inner wall or the bottom of said recess and an outer wall acting as a back-to-back cover which is at least partly transparent, said elongated passage in turn defining a path.

Said assembly proposed by the third aspect of the present invention further comprises a double-sided printed-circuit board like the one proposed by the second aspect of the invention and located in the same manner with respect to the mentioned elongated passage so as to achieve projecting light forwards and backwards in the same manner as in the assemblies proposed by the first and second aspects of the invention. The printed-circuit board is connected to a feed and control system in the same manner as the board proposed by the second aspect of the invention.

The assembly is designed such that, for all three proposed aspects, both the mentioned desired horizontal and vertical angles and light intensity comply with the stipulated regulation in each country for its corresponding homologation, either thanks to the arrangement of the LEDs on the board, to the characteristics of emission and/or to the nature thereof and/or to suitable optics included in the assembly.

BRIEF DESCRIPTION OF THE DRAWINGS

Other features of the invention will be clearer from the following description of some embodiments illustrated in the attached drawings and which must be considered as illustrative and non-limiting. In the drawings.

DETAILED DESCRIPTION OF SOME EMBODIMENTS

As shown in the figures, the rearview mirror assembly of an automotive vehicle with a flashing device proposed by the present invention comprises, according to the first and second aspects of the invention, a rearview mirror housing 1 with a first opening 3 in which said rearview mirror 14 is arranged and a second opening 4 defined in at least part of the rest of the outer perimeter of said housing 1, which is in the part opposite to the first opening 3.

Figure 3:
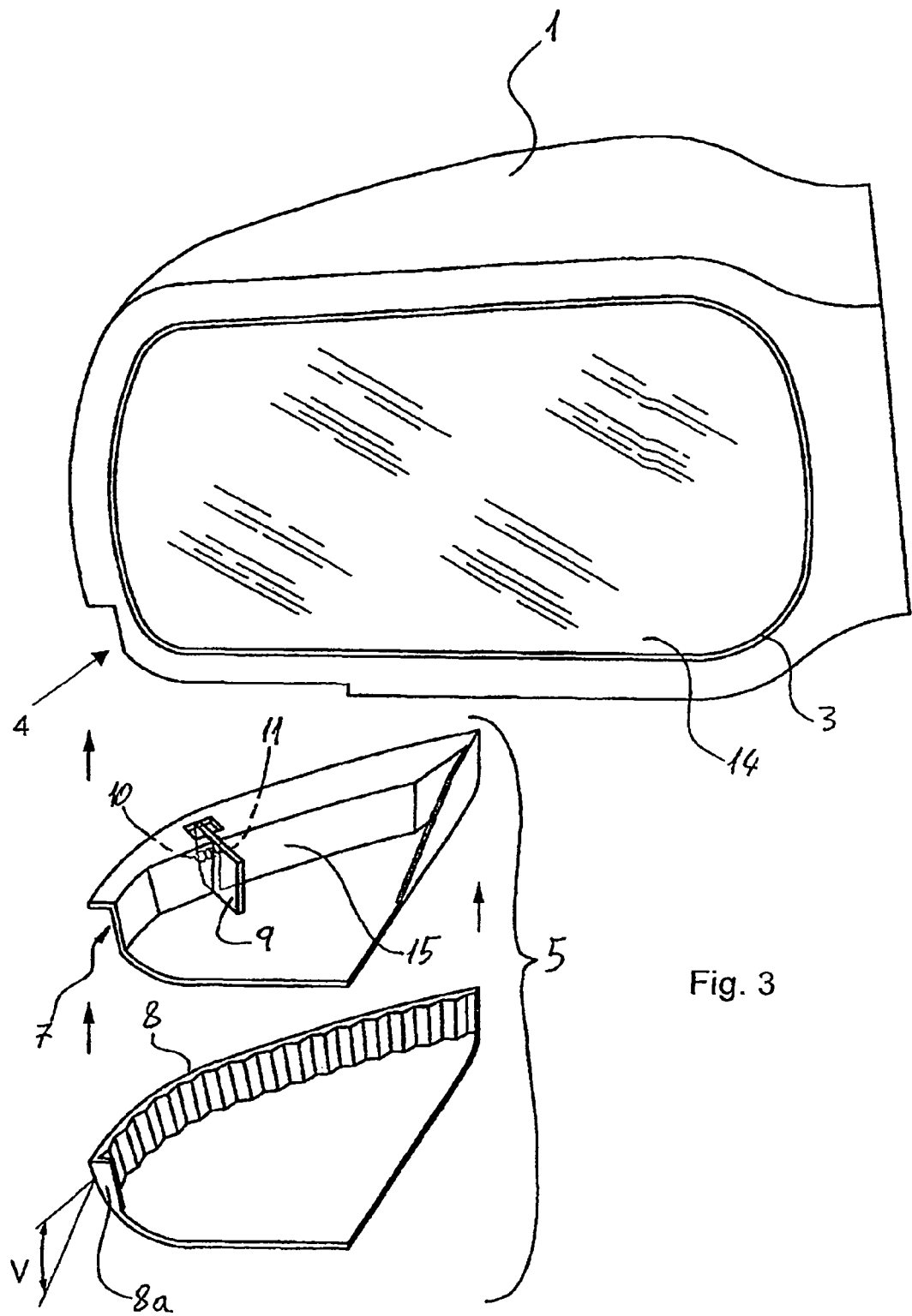
FIG. 3 is a perspective exploded view of the entire assembly proposed by the first and second aspects of the invention for another embodiment.

Said assembly which can be observed as a whole in FIG. 3 further comprises:

an outer module 5 (shown in detail in FIG. 1) which can be coupled to said housing 1 closing said second opening 4, said module 5 defining inwardly an elongated passage 7 delimited between two walls, an inner wall 15 and an outer wall acting as a cover 8 which is at least partly transparent, said passage defining a path, and a double-sided printed-circuit board 9 which is at least partly rigid for the first aspect of the invention, including at least one light emitting component 10, 11 in each of its sides C1, C2, said board 9 being electrically connected to a feed and control system located inside said automotive vehicle for the first aspect of the invention, and located, for the first aspect of the invention, perpendicularly and transversely with respect to said elongated passage 7, and for the second aspect, transversely with respect to the elongated passage 7 (being able to be arranged with a certain inclination for the second aspect), dividing the latter into two areas 7a, 7b, a rear area 7a with respect to the direction of travel extending from said board 9 to an end area 7a1 adjacent to the rearview mirror and visible together with the latter, and a front area 7b formed by the rest of the elongated passage 7 such that one 10 of said at least two light emitting components projects light along said rear area 7a, this light exiting by said end area 7a1 of the rear area 7a of said elongated passage 7 with desired horizontal H and vertical V angles through a transparent portion 8a of said cover 8, and at least another 11 of said two light emitting components located in the other side C2 of said printed-circuit board 9 projects light along said front area 7b, this light exiting through said cover 8.

In a third aspect, the invention also comprises a rearview mirror assembly (not shown) which unlike those proposed by the first and second aspects does not have the mentioned outer module 5 and therefore, nor the mentioned second opening 4 which closed said outer module 5, at least part of the outer perimeter of said housing 1 which is in the part opposite to said opening 3 being depressed towards the inside of the housing 1, defining said elongated passage 7 delimited between an inner wall or the bottom 15 of said recess and an outer wall acting as the cover 8 which is at least partly transparent, said elongated passage 7 defining a path.

As mentioned above, said assembly proposed by the third aspect of the invention further comprises a double-sided printed-circuit board 9 like the one proposed by the second aspect of the invention and located in the same manner with respect to the mentioned elongated passage so as to achieve projecting light forwards and backwards in the same manner as in the assemblies proposed by the first and second aspects of the invention.

The following explanation refers to the three aspects of the invention.

Evidently, only one or more light emitting components can be arranged in only one of the sides C1, C2 of the printed-circuit board 9 but this will clearly mean a much lower performance.

Figure 2:
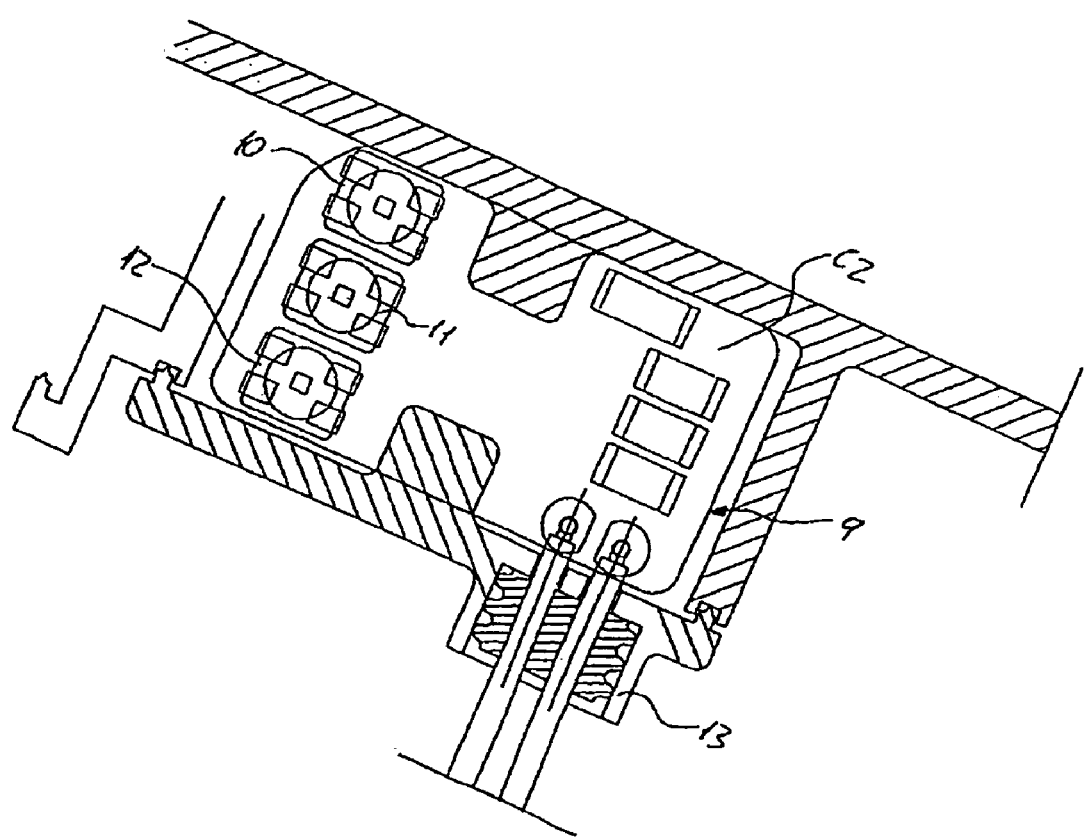
FIG. 2 is a detail showing the cross-sectional view in direction A of part of FIG. 1 where the circuit forming part of the present invention can be observed.

For the preferred embodiment shown in FIG. 2, said double-sided printed-circuit board 9 includes two light emitting components 10, 12 in at least one of its sides C1 which are preferably LEDs like the light emitting component 11 of said other side C2.

Obviously it is also possible (see FIG. 7) for the other side C2 to have two light emitting components 11, 110.

For another embodiment, said light emitting components 10, 12 are placed on said printed-circuit board 9 in a certain manner in relation to the elongated passage 7 so that, in combination with some emission characteristics thereof, they project light outside with said desired horizontal H and vertical V angles, generally to achieve the corresponding homologation of the proposed assembly.

In a further embodiment, the assembly additionally comprises optical means which, independently or in collaboration with said manner in which the light emitting components 10, 11, 12 are arranged and the mentioned emission characteristics thereof, make the light emitting components 10, 12 of one of the sides C1 of the printed-circuit board 9 project light backwards with said desired horizontal H and vertical V angles, and the light emitting component 11 of the other side C2 project light forwards, the light passing through the optical means in both cases.

Said desired horizontal angle H (see FIG. 1) is preferably equal to or greater than 55° and said desired vertical angle V (see FIG. 3) is preferable equal to or greater than 25°, these angles being measured with respect to coordinates placed in the endmost part of the vehicle which in this case are in the end of the assembly provided by the present invention, so as to comply with the current European regulation in force, although these angles could be others if the regulation changed.

Figure 1:
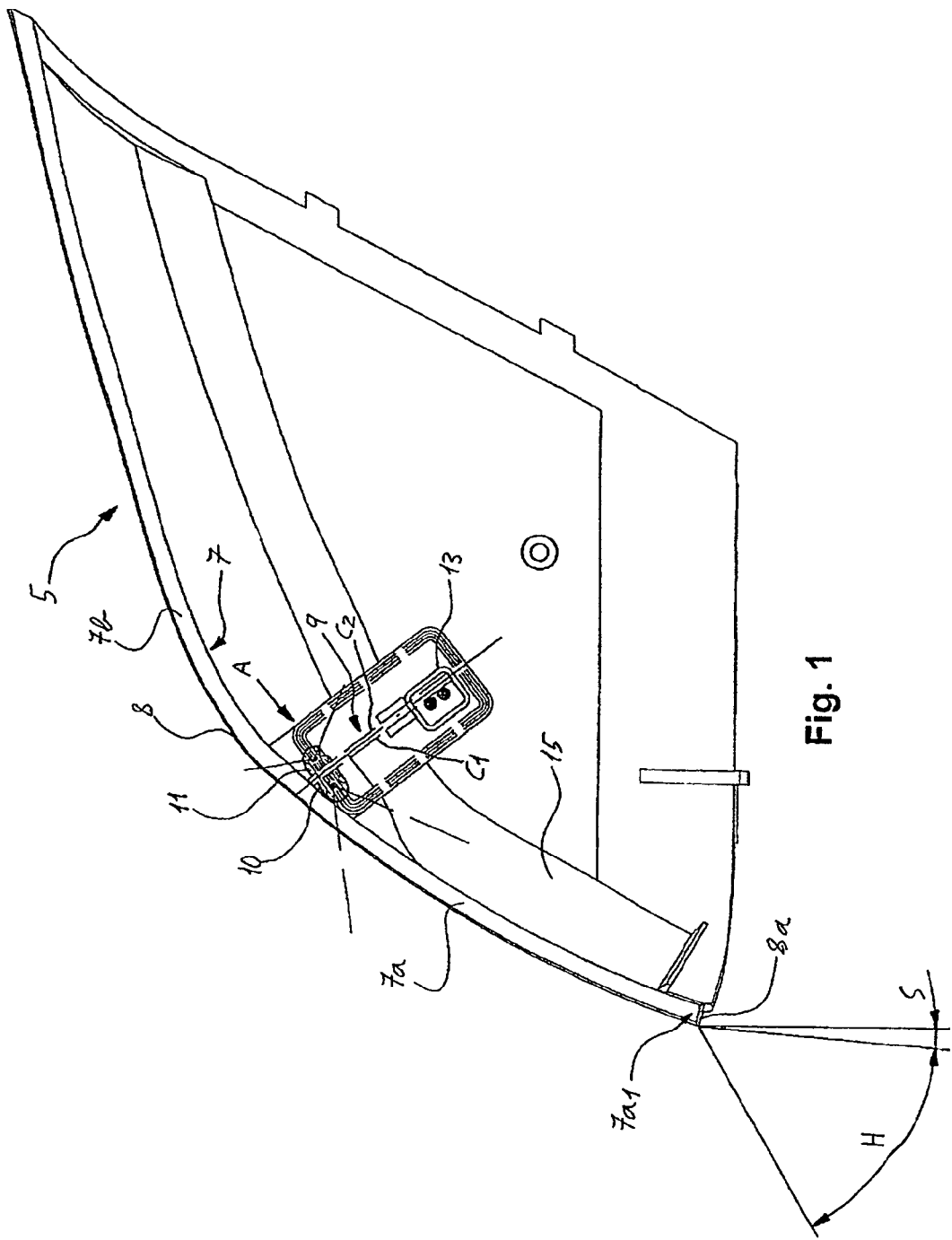
FIG. 1 is a plan view of the outer module of an exemplary assembly of the present invention, for an embodiment.

As can also be seen in FIG. 1, there is another angle S which refers to the shadow area and which must be approximately 5° to comply with the European homologation.

A further requirement necessary to comply with said homologation is the one that refers to luminous intensity which in Europe must be at least 0.5 candle power.

Said two light emitting components 10, 12 of said side C1 of the printed-circuit board 9 are spaced and located one above the other with respect to a vertical plane, as well as spaced and separated from one another with respect to a horizontal plane. Specifically, for the embodiment shown in FIG. 2, the latter are aligned with respect to a line parallel to one of the short sides of the board 9.

Said printed-circuit board 9 is preferably completely rigid and also preferably includes a circuitry for protecting said light emitting components 10, 11 formed by at least some resistances arranged in the printed-circuit board 9 by carbon laydown although they could be welded thereto for other embodiments.

Said optical means comprise plastic parts acting as optics which for one embodiment, are at least one lens which forms part of the light emitting components themselves, preferably LEDs, and/or for another embodiment is arranged thereupon after the injection of the lens in an insulating material likewise injected on the printed-circuit board 9, thus forming a type of tablet.

In another additional embodiment, said plastic parts form at least part of said cover 8 and are at least one lens and/or configurations of a prismatic geometry.

Said optical means further comprise reflector elements arranged in at least part of the inner surface of the inner wall 15.

In FIG. 2 it can be observed that said printed-circuit board 9 comprises a connector 13 which can be coupled to another corresponding connector (not shown) located in said outer module 5 or in said depressed perimeter of said housing 1 (for the third aspect of the invention), thus carrying out the mentioned electrical connection with said feed and control system.

Figure 4:
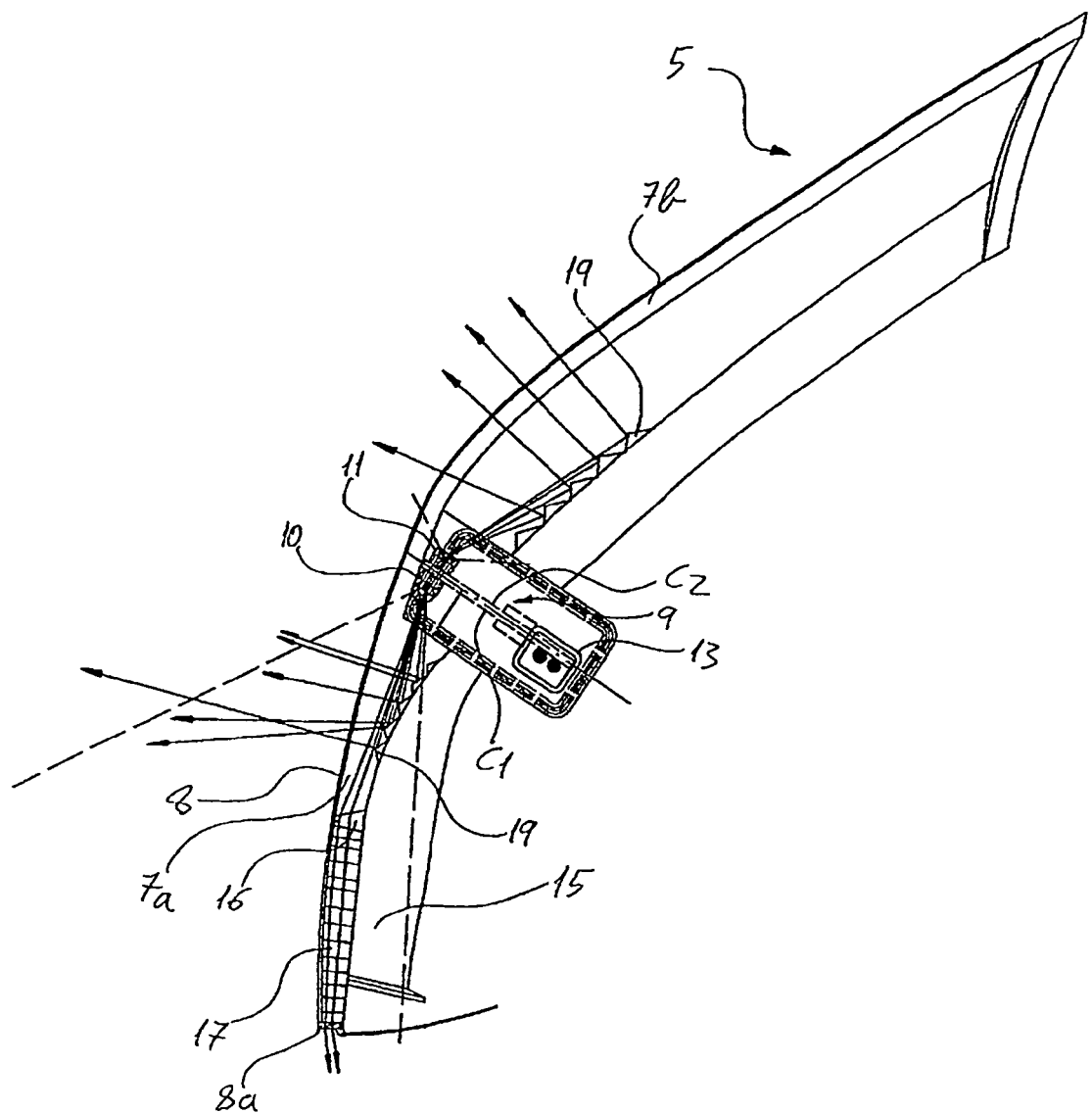
FIG. 4 is a plan view of the outer module belonging to an exemplary assembly of the present invention for another embodiment for which the invention comprises compensation optical means.

FIG. 4 shows another embodiment where due to said elongated passage 7 following a curved path in part of said rear area 7a, the light projected by the light emitting component 10 does not directly exit by said end area 7a1 with said desired horizontal H and vertical V angles, the assembly comprises compensation optical means to divert said light so that it really exits by said end area 7a1 with the desired horizontal H and vertical V angles through said transparent portion 8a of said cover 8.

For the embodiment shown in FIG. 4, said compensation optical means comprise a hollow transverse channel 16 of prismatic geometry located approximately in the point of tangency of the light projected by the light emitting component 10, from the geometric centre thereof, with the inner surface of said inner wall 15.

Additionally said compensation optical means also comprise a thickened portion 17 of the cover 8 from said transverse channel 16 to the end of the cover 8.

Preferably (see FIG. 4) the compensation optical means further comprise reflector elements arranged in at least part of the inner surface of the inner wall 15 delimiting said elongated passage 7 in said rear area 7a which can consist of a metal coating thereof.

FIG. 4 also shows the emitted rays of light represented by arrows and the different directions which they take due both to the compensation optical means pointed out and the commented optical means for the previous embodiments which the assembly depicted in FIG. 4 also incorporates. The same figure also shows the reflector elements 19 which can be included both in the optical means detailed previously and in the compensation optical means explained above.

It is interesting to emphasize that the printed-circuit board 9 comprises means for protection against weathering which are preferably materialized in the form of at least one material of those included in the group formed by: epoxy resin, polyamide, thermoplastic polyurethane, thermoplastic elastomer, rubber or any other suitable material.

Said material coats at least part of said printed-circuit board 9, specifically for a preferred embodiment, this material coats the entire printed-circuit board 9 except for the areas occupied by the light emitting components 10, 11, 12 so as to not make light emission difficult. Another embodiment contemplates the mentioned material being transparent; in this case being able to coat the entire board 9 without making said light emission difficult.

For another embodiment, the proposed assembly comprises a circuit 30 (see FIG. 5), arranged along at least one of said two areas 7a, 7b (generally the rear area 7b) of said elongated passage 7 so as to at least electrically connect the mentioned feed and control system with the printed-circuit board 9.

Figure 5:
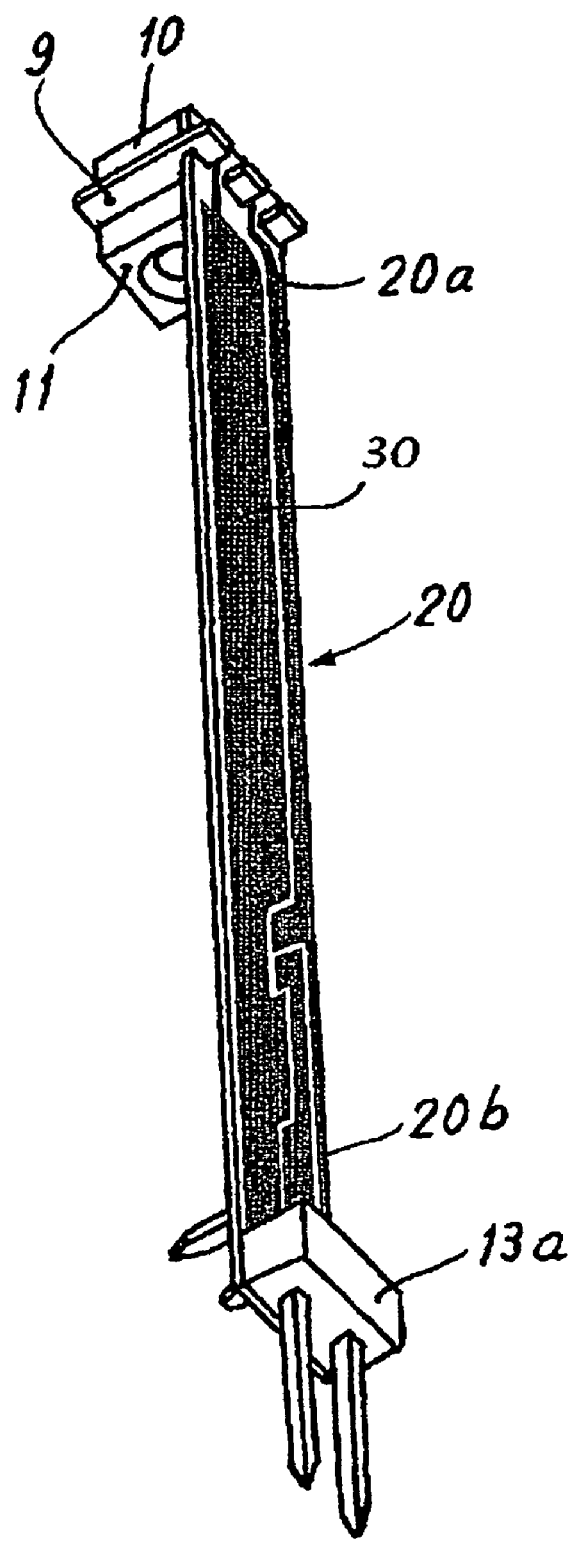
FIG. 5 is a perspective view of the proposed double-sided board for an embodiment.

FIG. 5 shows how the printed-circuit board 9, for an embodiment in which it has a LED 10, 11 at each side, is electrically connected to said circuit 30.

For an embodiment which is not shown, said circuit 30 includes a circuitry for protecting and/or polarizing said light emitting components 10, 11, 12, formed by a series of electronic components among which there is at least one of the group formed by: resistances and diodes, thus achieving that the printed-circuit board 9 can have more reduced dimensions since it does not need to incorporate more than the LEDs 10, 11, 12, the remaining components being incorporated in the circuit 30.

As can be seen in FIG. 5 said circuit 30 is supported by a generally double-sided flexible board 20 (with the purpose of being adapted to the shape of the area of the elongated passage 7 in which it will be located), with a first end 20a, near which said printed-circuit board 9 is connected, and a second distal end 20b near which said electronic components are arranged for another embodiment which is not shown.

Said flexible board 20 comprises a connector 13a which can be coupled to another corresponding connector (not shown) electrically connected with said feed and control system to feed and control said light emitting components or LEDs, 10, 11, 12.

For one embodiment, said flexible board 20 and/or said circuit 30 are formed or at least partly coated by a good heat sink material.

For another embodiment, the printed-circuit board 9 and/or the flexible board 20 comprise an electrically insulating dielectric layer of low thermal impedance electrically connected to said light emitting components 10, 11, 12 and/or to said circuit 30 and joined to a metallic substrate in order to dissipate the heat from said light emitting components 10, 11, 12 and/or said circuit 30.

Such printed-circuit boards incorporating a circuit layer (such as copper), a dielectric layer like the one mentioned and a metallic substrate are the ones known as T-Clad®, for example.

For another embodiment, the flexible board 20 and/or the associated circuit 30 and/or the printed-circuit board 9 are connected to an external heat sink element.

With the use of the flexible board 20, it is achieved that the heat is taken away from the LEDs 10, 11, 12 and from the areas in which they are housed and which are transverse to the elongated passage 7, either due to the commented arrangement of the electronic components which can generate heat in the end 20b furthest from the board 9 and/or due to the heat dissipation carried out by the latter according to any of the commented embodiments or a combination thereof.

This is extremely important because the heat may affect the emission characteristics of the LEDs, even the color thereof, which if this is the case, will mean a possible non compliance with the homologation for the compliance of which they had been initially designed.

Figure 8:
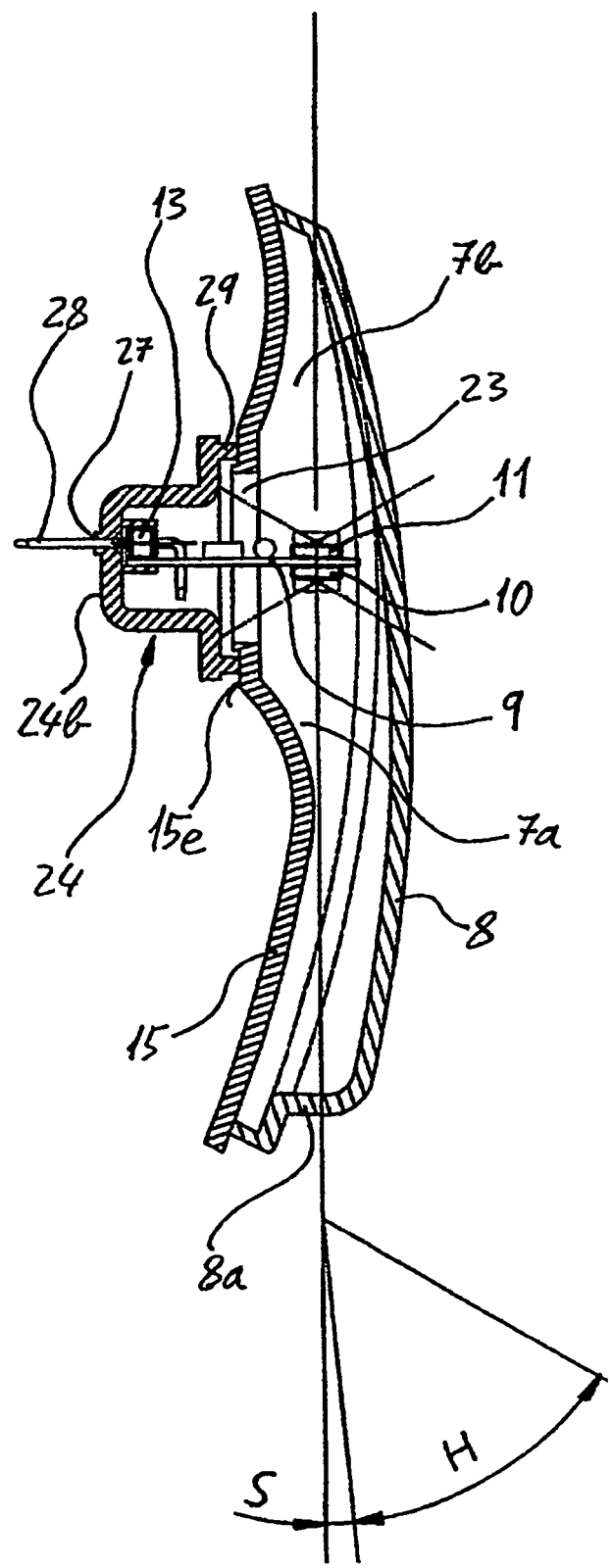
FIG. 8 is a sectional plan view of part of the proposed assembly where the proposed double-sided board can be observed introduced and positioned inside the elongated passage by means of a corresponding semi-capsule for an embodiment.
Figure 9:
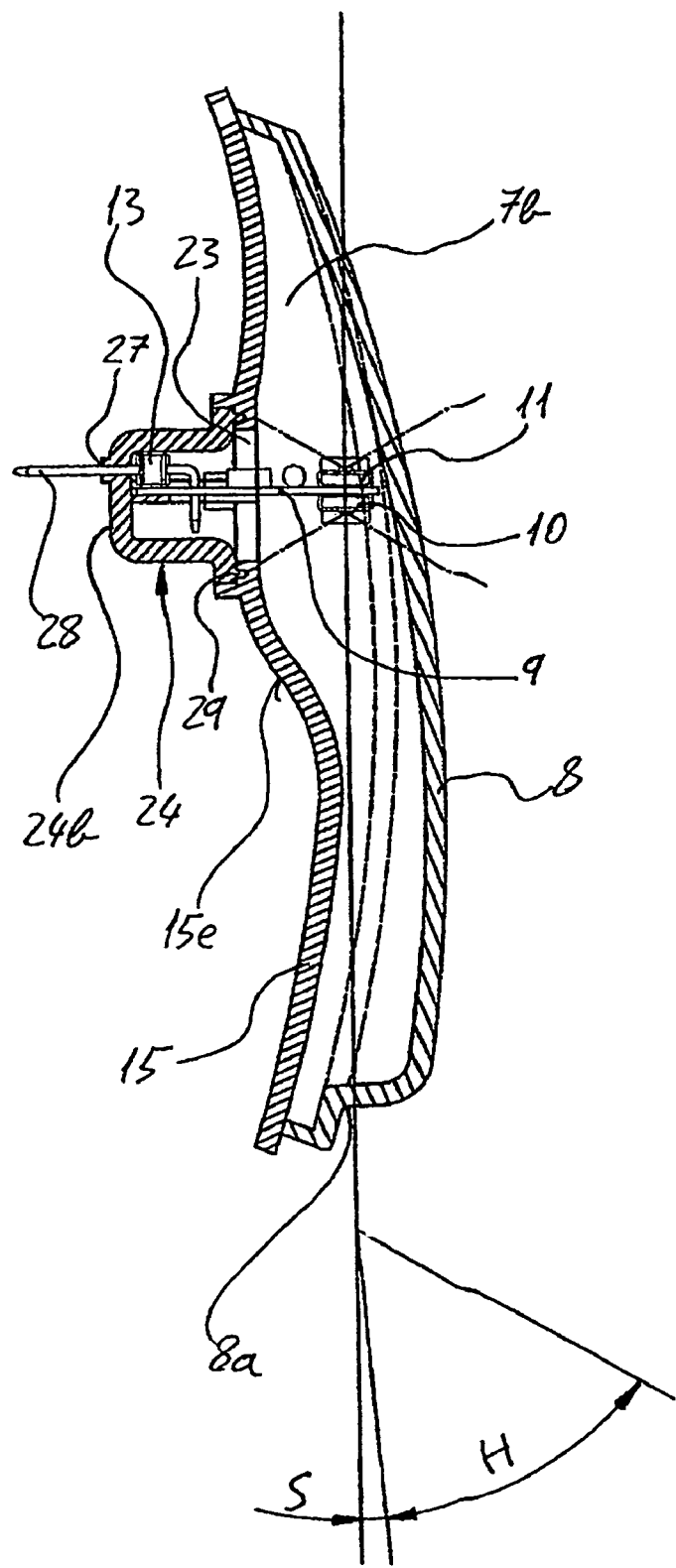
FIG. 9 is a view like that of FIG. 8 but for another embodiment in which the semi-capsule is fixed to the inner wall defining the elongated passage by means of a fixing system different from that of FIG. 8.

As shown in FIGS. 8 and 9, the inner wall 15 of the proposed assembly defines an opening 23 for introducing the printed-circuit board 9.

With the purpose of carrying out said introduction and according to the three aspects of the invention, the proposed assembly comprises a support and positioning semi-capsule 24 (see FIGS. 6, 7, 8 and 9) for carrying the printed-circuit board 9 and facilitating its positioning inside said elongated passage 7 in the mentioned position when 9 is at least partly introduced therein through said opening 23, such that said semi-capsule 24 is outside said elongated passage 7 covering said opening 23.

Said semi-capsule 24 comprises holding means to hold said printed-circuit board 9 by an end portion 9a.

Figure 6:
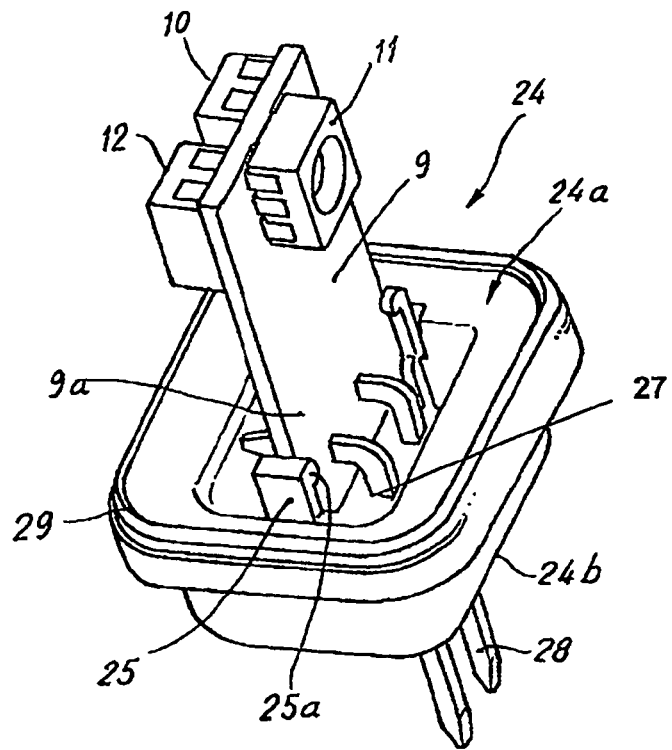
FIG. 6 is a perspective view showing the proposed double-sided board coupled to a support and positioning semi-capsule for an embodiment.
Figure 7:
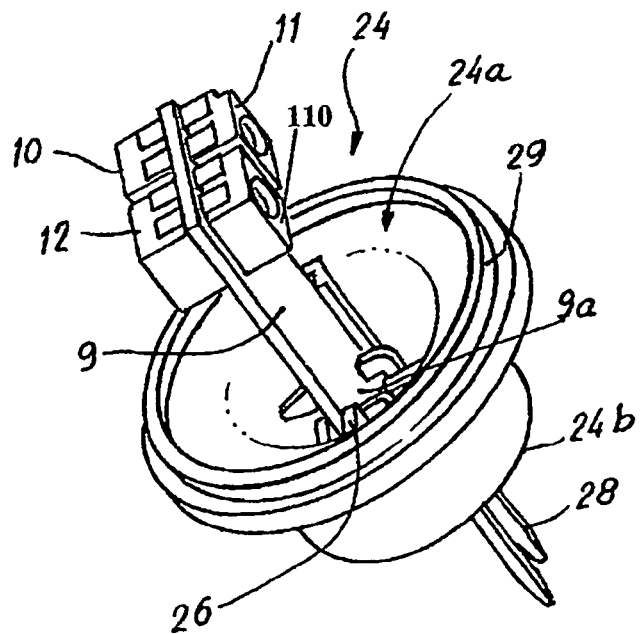
FIG. 7 is a perspective view showing the proposed double-sided board coupled to another support and positioning semi-capsule for another embodiment.

FIGS. 6 and 7 shows in perspective said semi-capsule 24 for two embodiments.

Specifically for the semi-capsule shown in FIG. 6, said holding means comprise two elastic tabs 25 (although they can be only one for another embodiment) with configurations which can collaborate with complementary configurations thereof (not shown) arranged in said end portion 9a of the printed-circuit board 9.

As can be seen on FIG. 6, said configurations of said holding means each comprise a boss 25a in the end of each tab 25 faced towards the inside of the semi-capsule 24 to hold the printed-circuit board 9 like a clamp by two complementary configurations arranged in said end portion 9a of said printed-circuit board 9.

On the other hand, for the embodiment illustrated by FIG. 7, the mentioned holding means comprise a configuration 26 for housing by coupling said printed-circuit board 9 by said end portion 9a.

The proposed semi-capsule 24 comprises through holes 27 (see FIGS. 6, 8 and 9) in its base 24b for the passage of a portion of metallic pins 28 connected to the printed-circuit board 9 to make the mentioned electrical connection with said feed and control system possible.

FIGS. 8 and 9 illustrate two embodiments showing the semi-capsule 24 once the printed-circuit board 9 has been introduced and positioned in the elongated passage 7, the semi-capsule 24 being fixed, around said opening 23, to the outer surface 15e of the inner wall 15 defining the elongated passage 7 together with the cover 8.

As can be seen in FIGS. 6 and 7, the semi-capsule 24 has a perimetric edge 29 along the outline of an open side 24a adapted to achieve said fixing.

For one embodiment (see FIGS. 7 and 8) said perimetric edge 29 is adapted such that said fixing is produced by means of friction welding.

For another embodiment (FIGS. 6 and 9) said perimetric edge 29 is adapted such that said fixing is produced by means of ultrasonic welding.

Obviously said fixing procedures are merely examples of all the possible procedures which could be applied with the assurance that the fixing was suitable and provided an acceptable tightness, as is achieved for the two embodiments illustrated in FIGS. 8 and 9.

A person skilled in the art could introduce changes and modifications in the described embodiments without departing from the scope of the invention as it is defined in the enclosed claims.

What is claimed is:

1. A rearview mirror assembly of an automotive vehicle with a flashing device comprising:
    a rearview mirror housing with a first opening in which the said rearview mirror is arranged and a second opening defined in at least part of the rest of the outer perimeter of said housing, which is in the part opposite to the first opening,
    an outer module which can be coupled to said housing closing said second opening, said outer module defining inwardly an elongated passage delimited between two walls, an inner wall and an outer wall acting as a cover which is at least partly transparent, said elongated passage defining a path, and
    a double-sided printed-circuit board including at least one light emitting component in each of its sides C1, C2, said board being electrically connected to a feed and control system and located transversely with respect to said elongated passage, dividing the latter into two areas, a rear area with respect to the direction of travel extending from said board to an end area adjacent to the rearview mirror and visible together with the latter, and a front area formed by the rest of the elongated passage such that one of said at least two light emitting components projects light along said rear area, this light exiting by said end area of the rear area of said elongated passage with desired horizontal and vertical angles through a transparent portion of said cover, and at least another of said two light emitting components located in the other side of said printed-circuit board projects light along said front area, this light exiting through said cover.

2. An assembly according to claim 1, wherein said double-sided printed-circuit board is at least partly rigid.

3. An assembly according to claim 1, wherein said double-sided printed-circuit board (9) is located perpendicularly with respect to said elongated passage.

4. An assembly according to claim 1, wherein said elongated passage follows a curved path in at least part of said rear area.

5. An assembly according to claim 4, further comprising compensation optical means allowing, when due to said curved path of at least part of said rear area of the elongated passage, the light projected by the light emitting component does not directly exit by said end area of the elongated passage with said desired horizontal and vertical angles, to divert said light so that it exits by said end area with said desired horizontal and vertical angles through said transparent portion of said cover.

6. An assembly according to claim 5, said compensation optical means comprise at least a hollow transverse channel of prismatic geometry located approximately in the point of tangency of the light projected by the light emitting component, from the geometric centre thereof, with an inner surface of said inner wall.

7. An assembly according to claim 6, said compensation optical means further comprise a thickened portion of the cover from said transverse channel to the end of the cover.

8. An assembly according to claim 5, wherein said compensation optical means further comprise reflector elements arranged in at least part of an inner surface of the inner wall delimiting said elongated passage in said rear area.

9. An assembly according to claim 1, wherein said double-sided printed-circuit board includes two light emitting components in at least one of its sides.

10. An assembly according to claim 9, wherein said light emitting components are placed on said printed-circuit board in a certain manner in relation to the elongated passage so that, in combination with some emission characteristics thereof, they project light outside with said desired horizontal and vertical angles.

11. An assembly according to claim 10, further comprising optical means which, independently or in collaboration with said certain manner in which the light emitting components are arranged and the mentioned emission characteristics thereof, make the light emitting components of one of the sides of the printed-circuit board project light outside backwards with said desired horizontal and vertical angles, and the light emitting component of the other side project light forwards, the light passing through said optical means in both cases.

12. An assembly according to claim 11, wherein said desired horizontal angle is equal to or greater than 55° and said desired vertical angle is equal to or greater than 25°.

13. An assembly according to claim 10, wherein said two light emitting components of said side of the printed-circuit board are spaced and located one above the other with respect to a vertical plane.

14. An assembly according to claim 13, wherein said two light emitting components of said side of the printed-circuit board are spaced and separated from one another with respect to a horizontal plane.

15. An assembly according to claim 11, wherein said light emitting components are LEDs.

16. An assembly according to claim 1, wherein said printed-circuit board includes a circuitry for protecting said light emitting components.

17. An assembly according to claim 16, wherein at least said protection circuitry is formed by at least some resistances arranged in the printed-circuit board by carbon or graphite laydown.

18. An assembly according to claim 11, wherein said optical means comprise plastic parts acting as optics.

19. An assembly according to claim 15, wherein said optical means comprise plastic parts acting as optics including at least one lens which forms part of the LEDs themselves and/or is arranged thereupon after the injection of the lens in an insulating material likewise injected on the printed-circuit board, thus forming a type of tablet.

20. An assembly according to claim 15, wherein said optical means comprise plastic parts acting as optics and forming at least part of said cover including at least one lens and/or configurations of a prismatic geometry.

21. An assembly according to claim 15, wherein said optical means further comprise reflector elements arranged in at least part of an inner surface of the inner wall.

22. An assembly according to claim 1, wherein said printed circuit board is completely rigid.

23. An assembly according to claim 1, wherein said printed-circuit board comprises a connector which can be coupled to another corresponding connector located in said outer module or in said depressed perimeter of said housing, thus carrying out the mentioned electrical connection with said feed and control system located inside said automotive vehicle.

24. An assembly according to claim 9, wherein said printed-circuit board comprises means for protection against weathering.

25. An assembly according to claim 24, wherein said means for protection are materialized in the form of at least one material selected from the group consisting of: epoxy resin, polyamide, thermoplastic polyurethane, thermoplastic elastomer and rubber.

26. An assembly according to claim 25, wherein said material coats at least part of said printed-circuit board.

27. An assembly according to claim 26, wherein said material coats the whole printed-circuit board except the areas occupied by the light emitting components.

28. An assembly according to claim 1, further comprising a circuit, arranged along at least one of said two areas of said elongated passage, so as to at least electrically connect said feed and control system with the printed-circuit board.

29. An assembly according to claim 28, wherein said circuit includes a circuitry for protecting and/or polarizing said light emitting components.

30. An assembly according to claim 29, wherein said circuitry for protecting and/or polarizing is formed by a series of electronic components among which there is at least one of the group formed by: resistances and diodes.

31. An assembly according to claim 30, wherein said circuit is supported by a flexible board with a first end, near which said printed-circuit board is connected, and a second distal end near which said electronic components are arranged.

32. An assembly according to claim 31, wherein said flexible board comprises a connector which can be coupled to another corresponding connector electrically connected with said feed and control system, to feed and control said light emitting components.

33. An assembly according to claim 31, wherein said flexible board and/or said circuit are formed or coated at least partly by a heat sink material.

34. An assembly according to claim 1, wherein said printed-circuit board and/or said flexible board comprise an intermediate electrically insulating dielectric layer of low thermal impedance electrically connected to said light emitting components and/or to said circuit and joined to a metallic substrate in order to dissipate the heat from said light emitting components and/or said circuit.

35. An assembly according to claim 31, wherein said flexible board and/or said circuit and/or said printed-circuit board are connected to a heat sink element.

36. An assembly according to claim 31, wherein said flexible board is double-sided.

37. An assembly according to claim 1, wherein said inner wall defines an opening for introducing said printed-circuit board.

38. An assembly according to claim 37, further comprising a support and positioning semi-capsule for carrying the printed-circuit board and facilitating its positioning inside said elongated passage in the mentioned position when said board is at least partly introduced through said opening, said semi-capsule being outside said elongated passage covering said opening.

39. An assembly according to claim 38, wherein said semi-capsule comprises holding means to hold said printed-circuit board by an end portion.

40. An assembly according to claim 39, wherein said holding means comprise at least one elastic tab with a configuration which can collaborate with a complementary configuration thereof arranged in said end portion of said printed-circuit board.

41. An assembly according to claim 40, wherein said holding means comprise two elastic tabs with respective configurations each of which comprise a boss in the end of each tab faced towards the inside of the semi-capsule to hold the printed-circuit board like a clamp by two complementary configurations arranged in said end portion of said printed-circuit board.

42. An assembly according to claim 39, wherein said holding means comprise a configuration for housing by coupling tightly said printed-circuit board by said end portion.

43. An assembly according to claim 38, wherein said semi-capsule comprises through holes in its base for the passage of a portion of metallic pins connected to said printed-circuit board to make the mentioned electrical connection with said feed and control system possible.

44. An assembly according to claim 38, wherein said semi-capsule has a perimetric edge along the outline of an open side adapted to achieve its fixing to the outer surface of the inner wall, around said opening.

45. An assembly according to claim 44, wherein said perimetric edge is adapted such that said fixing is produced by means of friction welding.

46. An assembly according to claim 44, wherein said perimetric edge is adapted such that said fixing is produced by means of ultrasonic welding.

47. An assembly according to claim 1, wherein said feed and control system is located inside said automotive vehicle.

48. An assembly according to claim 15, wherein said optical means comprise plastic parts acting as optics.

49. An assembly according to claim 32, wherein said flexible board is double-sided.

50. An assembly according to claim 33, wherein said flexible board is double-sided.

51. A rearview mirror assembly of an automotive vehicle with a flashing device comprising:
a rearview mirror housing with an opening in which said rearview mirror is arranged, at least part of the rest of the outer perimeter of said housing, which is in the part opposite to said opening, is depressed towards the inside of the housing, defining an elongated passage delimited between an inner wall of said recess and an outer wall acting as a cover which is at least partly transparent, said elongated passage defining a path;
a double-sided printed-circuit board including at least one light emitting component in each of its sides C1, C2, said board being electrically connected to a feed and control system and located transversely with respect to said elongated passage, dividing the latter into two areas, a rear area with respect to the direction of travel extending from said board to an end area adjacent to the rearview mirror and visible together with the latter, and a front area formed by the rest of the elongated passage such that one of said at least two light emitting components projects light along said rear area, this light exiting by said end area of the rear area of said elongated passage with desired horizontal and vertical angles through a transparent portion of said cover, and at least another of said two light emitting components located in the other side of said printed-circuit board projects light along said front area, this light exiting through said cover.

* * * * *